US007057411B2

(12) United States Patent
Her et al.

(10) Patent No.: US 7,057,411 B2
(45) Date of Patent: Jun. 6, 2006

(54) SEMICONDUCTOR INTEGRATED CIRCUIT INCLUDING TEST PINS AND METHOD FOR TESTING THEREOF

(75) Inventors: Nam-Jung Her, Suwon-shi (KR); Seok-Young Han, Yongin-shi (KR)

(73) Assignee: Samsung Electronics Co., Ltd. (KR)

( * ) Notice: Subject to any disclaimer, the term of this patent is extended or adjusted under 35 U.S.C. 154(b) by 30 days.

(21) Appl. No.: 10/802,472

(22) Filed: Mar. 16, 2004

(65) Prior Publication Data

US 2004/0183563 A1 Sep. 23, 2004

(30) Foreign Application Priority Data

Mar. 17, 2003 (KR) ..................... 10-2003-0016589

(51) Int. Cl.
*G01R 31/00* (2006.01)
*G01R 31/26* (2006.01)

(52) U.S. Cl. .................... 324/770; 324/765; 324/158.1

(58) Field of Classification Search ..................... None
See application file for complete search history.

(56) References Cited

U.S. PATENT DOCUMENTS 4,357,703 A * 11/1982 Van Brunt .................. 714/733
4,377,757 A * 3/1983 Konemann et al. ........... 326/16
5,043,985 A * 8/1991 Lin et al. .................... 714/731
5,225,774 A * 7/1993 Imamura ................. 324/158.1

FOREIGN PATENT DOCUMENTS

KR 1998-034558 8/1998
KR 10-0212108 5/1999

* cited by examiner

*Primary Examiner*—Paresh Patel
(74) *Attorney, Agent, or Firm*—Mills & Onello LLP

(57) ABSTRACT

A semiconductor integrated circuit comprises a plurality of data output pins, a test pin, a data processing circuit for generating output signals in response to input signals, and an output circuit for outputting the output signals to the data output pins in a normal mode and sequentially outputting each of the output signals to the test pin in response to a clock signal in a test mode. The test device includes only one test pin and the semiconductor integrated circuit may be tested by connecting the test pin of the test device to the test pin of the semiconductor integrated circuit. That is, the test device including only one test pin can test the semiconductor integrated circuit with n output pins.

4 Claims, 5 Drawing Sheets

100
Test Device
200
T1
TP
P1
P2
P3
P4
70
Pn-1
Pn
Channel Shifter
CLK
TM
S1
S2
S3
S4
Sn-1
Sn
60_1
AMP
60_2
AMP
60_3
60_4
60_n-1
60_n
50_1
MUX
50_2
50_n/2
40_1
N-Decoder
40_2
P-Decoder
40_3
40_4
40_n-1
40_n
30_1
Level Shifter
30_2
Level Shifter
30_3
30_4
30_n-1
30_n
20_1
MUX
20_2
20_n/2
10_1
Data Register
10_2
Data Register
10_3
10_4
10_n-1
10_n
D1
D2
D3
D4
Dn-1
Dn
from Host Controller 300
200
Test Device
T1
TP
80
Shift Register
CLK
P1
P2
P3
P4
Pn-1
Pn
S1
S2
S3
S4
Sn-1
Sn
60_1
60_2
60_3
60_4
60_n-1
60_n
AMP
50_1
50_2
50_n/2
MUX
40_1
40_2
40_3
40_4
40_n-1
40_n
N-Decoder
P-Decoder
30_1
30_2
30_3
30_4
30_n-1
30_n
Level Shifter
20_1
20_2
20_n/2
MUX
10_1
10_2
10_3
10_4
10_n-1
10_n
Data Register
D1
D2
D3
D4
Dn-1
Dn
from Host Controller

SEMICONDUCTOR INTEGRATED CIRCUIT INCLUDING TEST PINS AND METHOD FOR TESTING THEREOF

FIELD OF THE INVENTION

The present invention generally relates to semiconductor integrated circuits and, more specifically, to semiconductor integrated circuits with a plurality of data output pins and methods for testing thereof.

BACKGROUND OF THE INVENTION

A module construction of a typical TFT-LCD (thin film transistor liquid crystal display) module is illustrated in FIG. 1.

Referring to FIG. 1, an LCD module 1 includes a driving circuit unit 2, an LCD panel 5, and a backlight unit 7.

The driving circuit unit 2 has a plurality of gate driver ICs 6A–6C and source driving ICs 6C–6E for driving a panel 5 and printed circuit boards (PCBs) 3 and 4 to which a variety of circuit components such as a timing controller are attached. The LCD panel 5 has a shape where a liquid crystal is inserted into two glasses between substrates. The LCD panel 5 controls amount of white plane light that is incident from the backlight unit 7 to transmit pixels, serving to display color images in response to each pixel signal voltage inputted from the driving circuit unit 2. The backlight unit 7 has a lamp 8 and a reflex plate 9 and makes plane light having a unit bright from a fluorescent lamp 8 acting as a light source.

As well known to those skilled in the art, the LCD panel 5 includes gate lines and source lines that are intersected in a lattice shape. A pixel is coupled to a gate line and a data line. For example, an LCD panel for a VGA (video graphics array) mode includes 640×480 pixels, and an LCD panel for an XGA (extended graphics array) mode includes 1024×768 pixels. To drive a number of pixels, a gate driver IC and a source driving IC have a number of output pins. The number of these output pins is dependent upon the resolution of the LCD panel 5 that the IC employs. Since an IC cannot have innumerable output pins, the LCD module 1 uses a plurality of ICs that are serially connected. For example, since the LCD panel for the VGA mode has 640 source lines, source driving ICs having 320 output pins must be serially connected by two or a source driving IC having 640 pins may be used.

Generally, a semiconductor integrated circuit is tested by assigning test pins of a test device to all input/output pins in a one-on-one relationship. However, there are required a number of test pins to test integrated circuits having many input/output pins like the foregoing integrated circuits for driving an LCD, i.e., a gate driver IC or a source driving IC.

With scale-up and high definition of LCD panels, the number of pins installed at driving ICs is increasing and a pitch between pins is decreasing. This leads to a difficulty in increasing the number of pins of a test device as pins of the semiconductor integrated circuit increase in number.

SUMMARY OF THE INVENTION

Embodiments of the present invention are to provide semiconductor devices including test pins for sequentially generating output signals in a test mode.

Still other embodiments of the present invention are to treat methods for testing semiconductor integrated circuits using a test device including small numbers of test pins.

In some embodiments of the present invention, a semiconductor integrated circuit comprises a plurality of data output pins, a test pin, a data processing circuit for generating output signals in response to input signals, and an output circuit for outputting the output signals to the data output pins in a normal mode and sequentially outputting the output signals to the test pins in response to a clock signal in a test mode.

In one embodiment, the output circuit controls the output signals not to be outputted to the data output pins in the test mode.

In some embodiments of the present invention, a semiconductor integrated circuit comprises a plurality of output pins, a test pin, a data processing circuit for generating output signals in response to input signals and transferring the generated output signals to the data output pins, and an output circuit for sequentially outputting the output signals to the test pins in response to a clock signal.

In one embodiment, the output circuit comprises a shift register operating in response to the clock signal.

In some embodiments of the present invention, a method for generating data in a test mode of a semiconductor integrated circuit with a plurality of data output pins and test pins, comprises determining whether the test mode is activated and sequentially outputting the output signals to the test pins in response to a clock signal in the test mode.

In one embodiment, the output signals are output to the data output pins if the test mode is not activated.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

The present invention will be described more fully hereinafter with reference to the accompanying drawings, in which preferred embodiments of the invention are shown.

Figure 1:
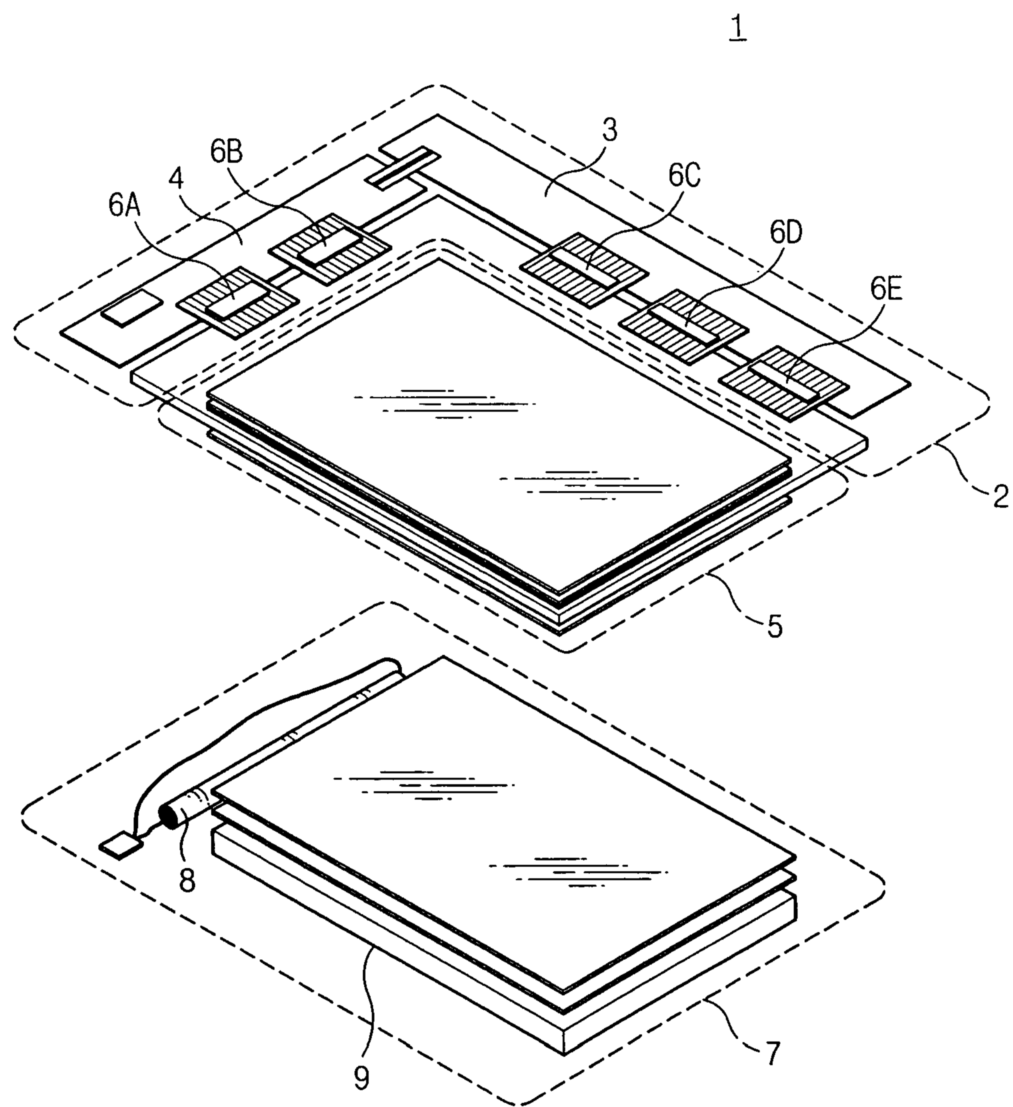
FIG. 1 is a schematic perspective view of a module construction of a typical thin film transistor-liquid crystal display (TFT-LCD).
Figure 2:
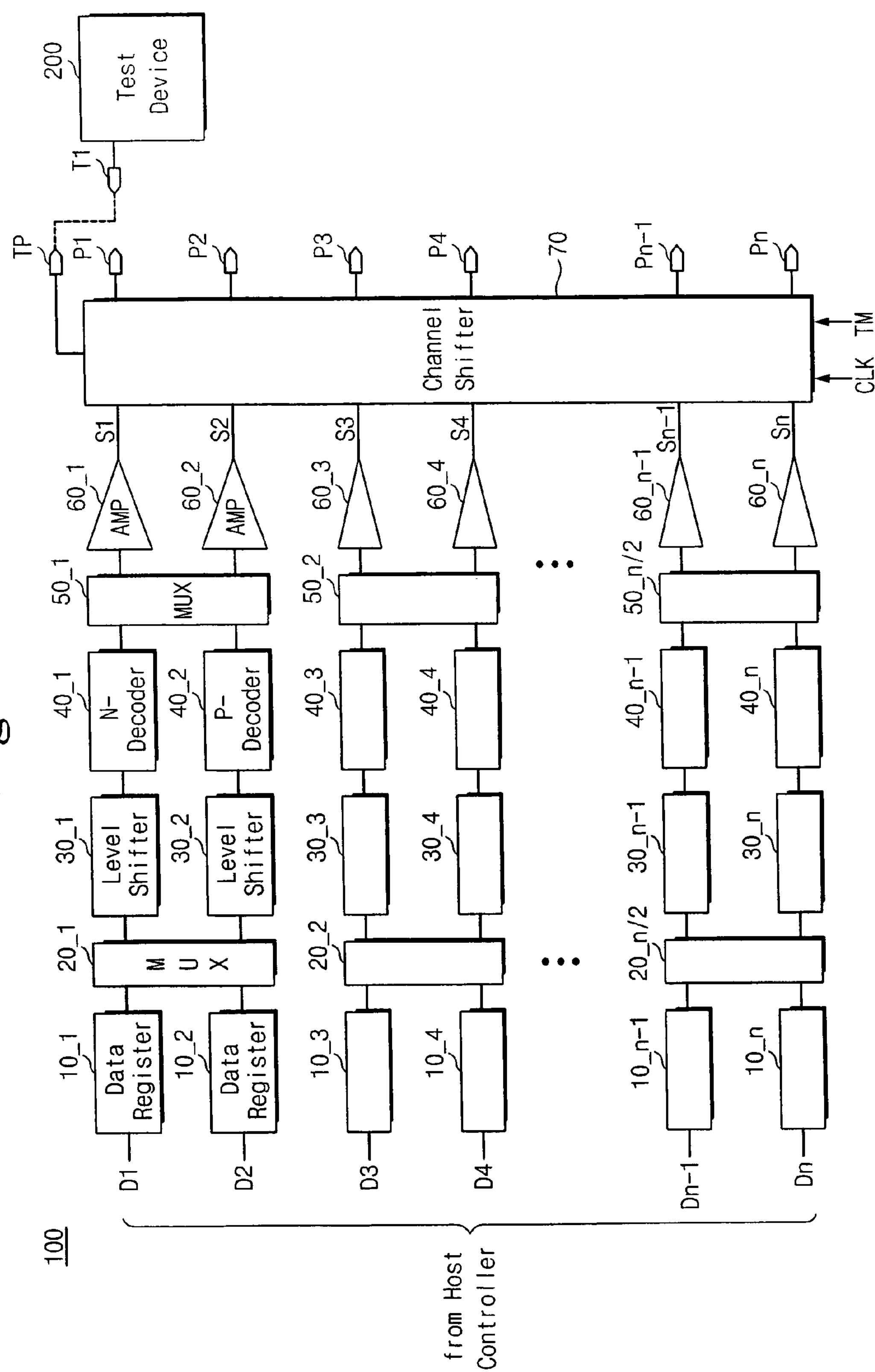
FIG. 2 is a schematic block diagram of a circuit of a source driving integrated circuit (IC) according to an exemplary embodiment of the invention.

FIG. 2 is a block diagram showing an inner circuit of a source driving integrated circuit (IC) according to an exemplary embodiment. Referring to FIG. 2, a source driving IC 100 comprises data registers 10_1~10_n, multiplexers 20$_{13}$1~20_n/2 and 50_1~50_n/2, level shifters 30_1~30_n, N-decoders 40_1, 40_3, . . . and 10_n–1, P-decoders 40_2, 40_4, . . . and 40_n, amplifiers 60_1~60_n, a channel shifter 70, data output pins P1~Pn and test pin (TP).

The data registers 10_1~10_n receive and store RGB data signals D1–Dn provided from a host controller (not shown). The multiplexers 20_1~20_n/2 are connected to the data registers, with each multiplexer being connected to two data registers as shown, and transmit the data signals stored in the connected data registers to level shifters 30_1~30_n. For example, the multiplexer 20_1 transfers the data signals stored in the data registers 10_1 and 10_2 to lever shifters 30_1 and 30_2, respectively, and change a direction of transferring at a predetermined period. That is, in a first period, a multiplexer 20_1 transfers data stored in a data register 10_1 to a level shifter 30_1 and data stored in a data register 10_2 to a level shifter 30_2. In a second period, multiplexer 20_1 transfers data stored in the data register 10_1 to the level shifter 30_2, and data stored in the data register 10_2 to the level shifter 30_1. Operations of the other multiplexers 20_1~20_n/2 are performed in the same manner as the multiplexer $\mathbf{20}_{\_1}$.

The level shifters 30_1~30_n raise the voltage levels of the data signals transferred from the corresponding multiplexers 20_1~20_n up to the voltage level suitable for drive pixels (i.e., a liquid crystal).

N-decoders 40_1, 40_3, . . . and 40_n−1 and P-decoders 40_2, 40_4, and 40_n decode the data signals with the levels raised by the corresponding the level shifters 30_1~30_n. That is, the N-decoders 40_1, 40_3, and 40_n select and output one of external gradation voltages according to data signals transferred from the corresponding the level shifters 30_1, 30_3, . . . and 30_n−1. P-decoders $\mathbf{40}_{\_2,\ 40}$_4, and 40_n select and output one of external gradation voltages according to data signals transferred from the corresponding the level shifters $\mathbf{30}_{13}$ 1, 30_3, . . . and 30_n−1.

The the multiplexers transfer the data stored in the data register 10_1 and 10_2 across to the level shifters 30_1 and 30_2 to reverse the levels of data signals on the basis of reference voltage and transfer to pixels at a predetermined period. This prevents degradation of the liquid crystal. For instance, the external gradation voltages provided to the N-decoders 40_1, 40_3, . . . and 40_n−1 have the range of 0~7V, and the external gradation voltages provided to the P-decoders 40_2, 40_4, . . . and 40_n have the range of 8~15V. Therefore, in a first cycle, data signals D1, D3, . . . and D_n−1 are decoded into one of the 0 through 7V-gradation voltages by the N-decoders 40_1, 40_3, . . . and 40_n−1, data signals D2, D4, . . . and D_n are decoded into one of 8 through 15 V-gradation voltages by the P-decoders 40_2, 40_4, . . . and 40_n. In second cycle, the external signals D1, D3, . . . D_n−1 are decoded into one of 8 through 15V-gradation voltages by the P-decoders 40_2, 40_4, . . . and 40_n, and data signals D2, D4, . . . D_n are decoded into one of 0 through 7V-gradation voltages by N-decoders 40_1, 40_3, . . . and 40_n−1.

Each of Multiplexers 50_1, 50_3, . . . and 50_n−1 is connected to one N-decoder and one P-decoder, and transfers the gradation voltages provided from the connected decoders to amplifiers $\mathbf{60}_{13}$ 1~60_n. The multiplexers 50_1, 50_3, and 50_n−1 gear with the multiplexers 20_1, 20_ 3, . . . and 20_n−1. For example, if the multiplexer 20_1 transfers the data signal D1 stored in the data register 10_1 to the level shifter 30_1 and provides the data signal D2 stored in the data register 10_2 to the level shifter 30_2, the multiplexer 60_1 transfers a signal outputted from the N-decoder 40_1 to the amplifier 60_1, and transfers a signal outputted from the P-decoder 40_2 to the amplifier 60_2. The operation of the other multiplexers 50_2~50_n/2 is the same as that of the multiplexer 50_1 and therefore description thereof will not be repeated.

Signals S1–Sn outputted from the amplifiers 60_1~60_n are provided to a pixel of a corresponding LCD panel (not shown) through data output pins P1–Pn acting as source driving signals. In a normal mode, the source driving signals S1–Sn outputted from the amplifiers 60_1–60_n are provided to the LCD panel through the data output pins P1–Pn. However, during a test mode, the source driving signals S1–Sn outputted from the amplifiers 60_1~60_n are outputted through a channel shifter 70 to a test pin TP. The data output operations in normal and test modes will be described with reference to FIG. 3, hereinafter.

Figure 3:
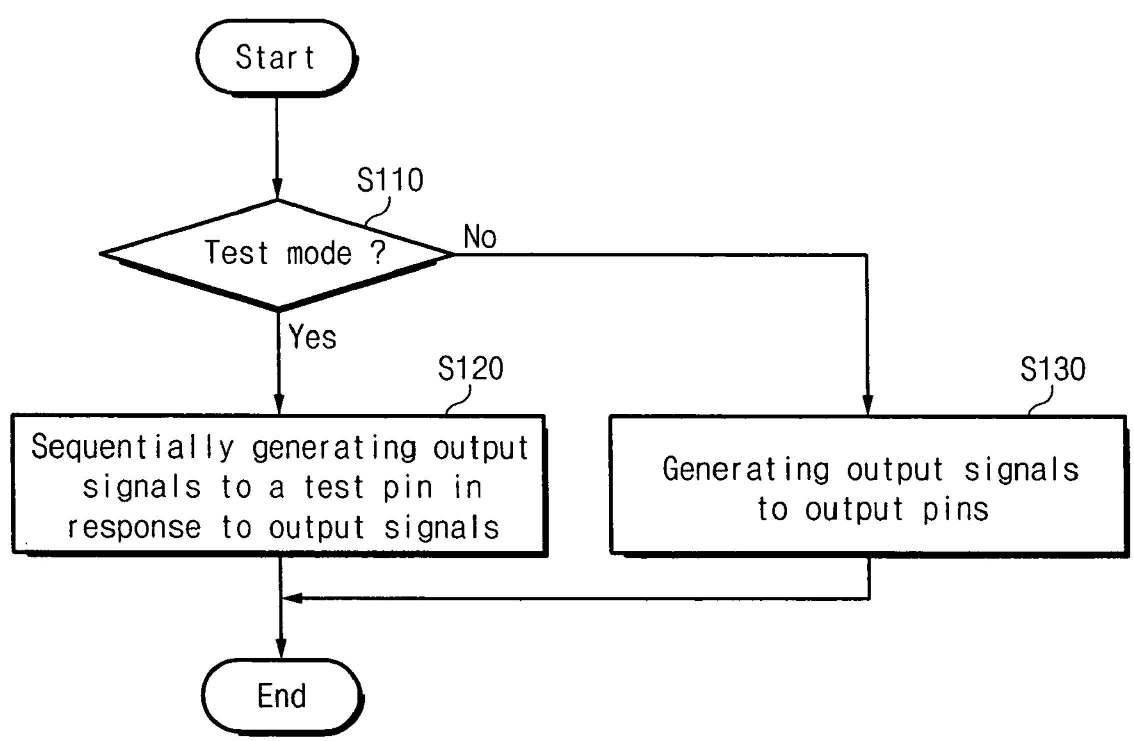
FIG. 3 is a flowchart showing a control procedure of a channel shifter in the source driving IC illustrated in FIG. 2.

FIG. 3 is a flowchart showing the steps of controlling the channel shifter 70 in the source driving IC 100 of FIG. 2. The channel shifter 70 operates in response to a test mode signal TM. The test mode signal TM has a low level (i.e., logic "0") in a normal mode and has a high level (i.e., logic "1") in a test mode.

In step S110, the channel shifter 70 determines whether the test mode signal TM indicates a test mode. When the test mode signal TM indicates the normal mode, not the test mode, the control routine proceeds to step S130.

In step S130, the channel shifter 70 outputs the source driving signals S1–Sn outputted from the amplifiers 60_160_n to output pins P1–Pn. For example, the source driving signal S1 outputted from the amplifier 60_1 is outputted to the output pin P1 through the multiplexer 70_1, and the source driving signal S2 outputted from the amplifier 60_2 is outputted to the output pin P2 through the multiplexer 70_2. The source driving signals S1~Sn correspond to output pins P1~Pn one-to-one.

When the test mode signal TM indicates the test mode,i.e., high level, as a result of determination of the step S110, this control routine proceeds to step S120 in which a first test cycle starts. In step S120, the channel shifter 70 sequentially outputs the source driving signals S1~Sn outputted from the amplifier 60_1~60_n in response to a clock signal CLK.

Figure 4:
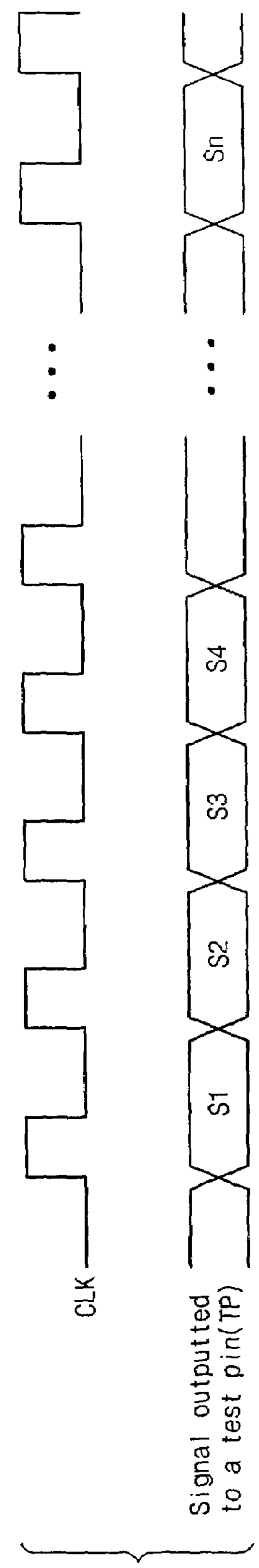
FIG. 4 is a timing diagram showing a clock signal and output signals from a test pin (TP), in accordance with the present invention.

FIG. 4 is a timing diagram showing a clock signal and a signal outputted to a test pin TP. Referring to FIG. 4, source driving signals S1~Sn outputted from the amplifiers 60_1~60_n are sequentially outputted to a test pin TP at each rising edge of a clock signal. That is, the channel shifter 70 outputs, at a first rising edge of the clock signal CLK, the source driving signal S1 outputted from the amplifier 60_1 to the test pin TP. In this case, the channel shifter 70 does not output the source driving signal S1 outputted from the amplifier 60_1 to an output pin P1. At a second rising edge of the clock signal CLK, the channel shifter 70 outputs the source driving signal S2 outputted from the amplifier 60_2 to the test pin TP. In this case, the channel shifter 70 does not output the source driving signal S2 outputted from the amplifier 60_2 to an output pin P2. In this manner, the channel shifter 70 sequentially outputs the source diving signals S2~Sn outputted from the amplifiers 60_3~60_n to the test pin TP in response to from third to nth rising edges of the clock signal CLK.

Accordingly, a test driver 200 includes only one test pin T1 and may test a source drive IC 100 by connecting the test pin TP of the source drive IC 100 to the test pin T1 of the test device 200.

In the above embodiment, the channel shifter 70 operates in response to a test mode signal TM indicating a test/normal mode but may operate in a test/normal mode according whether the clock signal CLK is inputted or not. That is, the channel shifter 70 may operate in a test mode when the clock signal CLK is inputted but operate in a normal mode when the clock signal CLK is not inputted.

Figure 5:
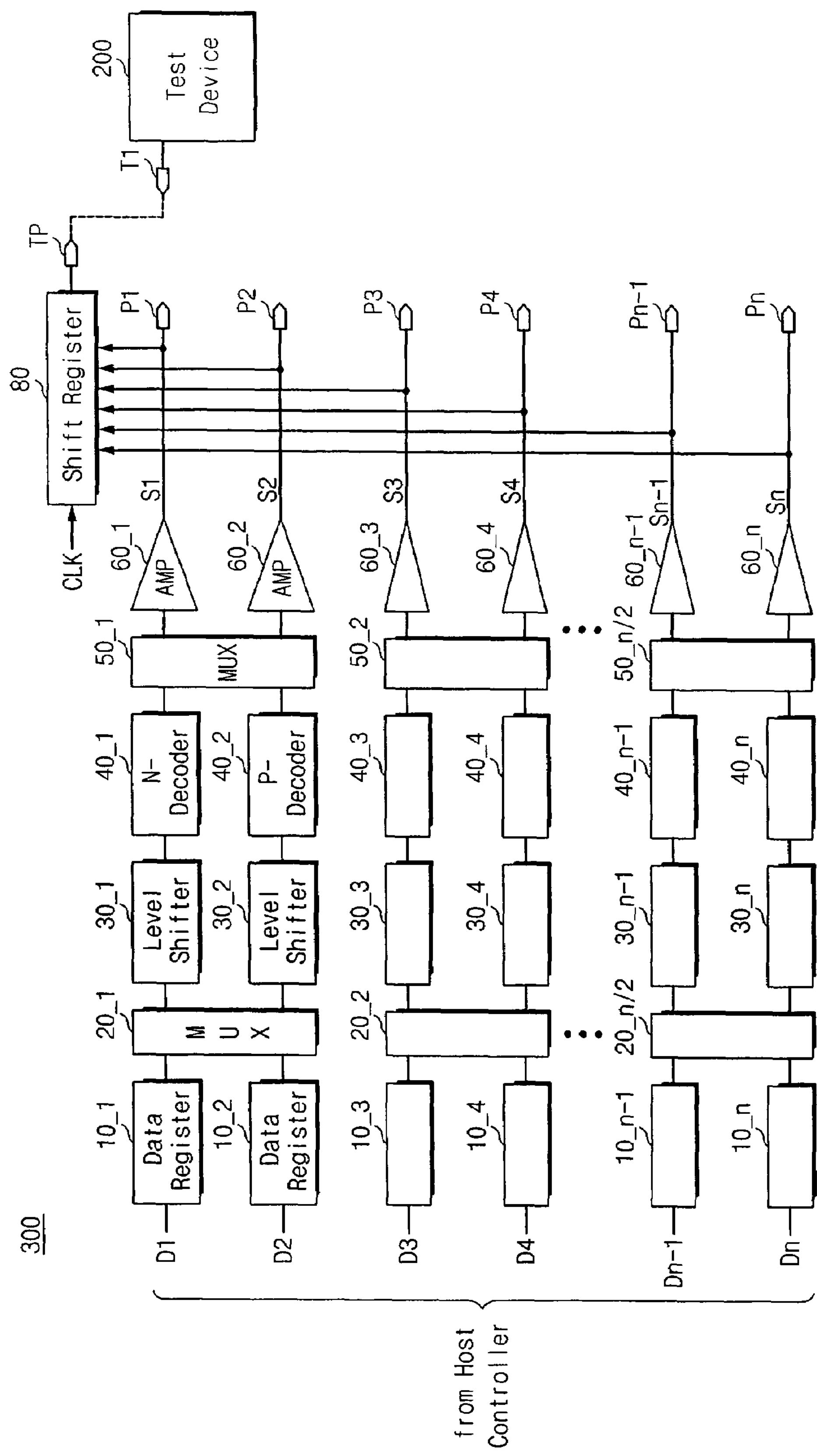
FIG. 5 is a block diagram of a source driving IC according to another exemplary embodiment of the present invention.

A source driving IC according to another embodiment of the present invention is illustrated in FIG. 5. Unlike the source driving IC 100 of FIG. 2, the source driving IC 300 of FIG. 5 includes a shift register 80 instead of the channel shifter 70 of the source drive IC 100. In FIG. 5 and FIG. 2, the same reference numerals denote the same components.

Referring to FIG. 5, the shift register 80 includes receive and store source driving signals S1~Sn outputted from amplifiers 60_1~60_n. The shift register 80 outputs the stored source driving signals S1~Sn to a test pin TP in response to a clock signal CLK. The operation of the shift register 80 is the same as that of timing diagram illustrated in FIG. 4. That is to say, the shifter register 80 sequentially outputs the source driving signals S1~Sn stored therein to the test pin TP at each rising edge of the clock signal CLK. For example, the shift register 80 outputs, at a first rising edge of the clock signal CLK, the source driving signal S1 to the test pin TP. The channel shifter 70 outputs the source driving signal S2 to the test pin TP at a second rising edge of the clock signal CLK, and the source driving signal Sn to the test pin TP at an nth rising edge of the clock signal CLK.

Therefore, the test device 200 includes only one test pin T1 and may test the source drive IC 300 by connecting the test pin TP of a source drive IC 300 to the test pin T1 of the test device 200. If the test device 200 includes a plurality of test pins, the test device 200 can test a plurality of semiconductor chips at the same time.

As described herein, a test device only one test pins is used to test a semiconductor integrated circuit having n output pins. Hence, although there are a number of output pins of a semiconductor integrated circuit, a test device may test the semiconductor integrated circuit with only one pin. Therefore, it is possible to easily fabricate the test device and to fabricate the same at a low cost. A test device having a plurality of output pins can test a plurality of semiconductor integrated circuits at the same time.

Other modifications and variations to the invention will be apparent to a person skilled in the art from the foregoing disclosure. Thus, while only certain embodiment of the invention has been specifically described herein, it will be apparent that numerous modifications may be made thereto without departing from the spirit and scope of the invention.

What is claimed is:

1. A semiconductor integrated circuit comprising:

a plurality of data input pins for receiving data signals in a normal mode and at least one of the plurality of data input pins for receiving test signals in a test mode, such that the data input pins can receive both the data signals and the test signals;

a plurality of data output pins;

a test pin;

a data processing circuit for generating output signals in response to input signals; and an output circuit for outputting the output signals to the data output pins in the normal mode and sequentially outputting the output signals to the test pin in response to a clock signal in the test mode.

2. The integrated circuit of claim 1, wherein the output circuit controls the output signals not to be outputted to the data output pins in the test mode.

3. A method for receiving test data signals and outputting data in a test mode of a semiconductor integrated circuit with a plurality of data input pins and a plurality of data output pins and a test pin, comprising:

receiving data signals at the plurality of data input pins during a normal mode and receiving test data signals at the plurality of data input pins during the test mode, such that the data input pins can receive both the data signals and the test signals;

determining whether the test mode is activated; and sequentially outputting the output signals to the test pin in response to a clock signal in the test mode.

4. The method of claim 3, further comprising outputting the output signals to the data output pins if the test mode is not activated.

* * * * *